(12) United States Patent
Hill

(10) Patent No.: US 6,621,351 B2
(45) Date of Patent: Sep. 16, 2003

(54) RF AMPLIFIER AND METHOD THEREFOR

(75) Inventor: Darrell Hill, Tempe, AZ (US)

(73) Assignee: Motorola, Inc., Schaumburg, IL (US)

( * ) Notice: Subject to any disclaimer, the term of this patent is extended or adjusted under 35 U.S.C. 154(b) by 118 days.

(21) Appl. No.: 09/935,948

(22) Filed: Aug. 23, 2001

(65) Prior Publication Data

US 2003/0038680 A1 Feb. 27, 2003

(51) Int. Cl.[7] .................................................. H02H 7/00
(52) U.S. Cl. ..................... 330/298; 330/207 P; 330/307
(58) Field of Search ............................. 330/298, 207 P, 330/307, 285, 284

(56) References Cited

U.S. PATENT DOCUMENTS

| | | | | |
|---|---|---|---|---|
| 3,786,364 A | * | 1/1974 | Wheatley, Jr. | 330/298 |
| 3,792,316 A | * | 2/1974 | Bondini et al. | 361/79 |
| 3,992,678 A | * | 11/1976 | Suzuki | 330/207 P |
| 4,074,334 A | * | 2/1978 | D'Arrigo et al. | 361/79 |
| 4,355,341 A | * | 10/1982 | Kaplan | 361/79 |
| 4,673,886 A | * | 6/1987 | Bickley et al. | 330/298 |
| 5,357,089 A | * | 10/1994 | Prentice | 330/298 |
| 5,371,477 A | * | 12/1994 | Ikeda et al. | 330/282 |
| 5,696,467 A | * | 12/1997 | McPhilmy et al. | 330/298 |
| 5,917,382 A | * | 6/1999 | Chiozzi | 330/298 |
| 6,014,059 A | * | 1/2000 | Nordwall | 330/289 |
| 6,081,161 A | * | 6/2000 | Dacus et al. | 330/297 |
| 6,121,841 A | * | 9/2000 | Sakuno | 330/285 |
| 6,137,366 A | * | 10/2000 | King | 330/298 |
| 2002/0024390 A1 | * | 2/2002 | Yamashita et al. | 330/298 |

FOREIGN PATENT DOCUMENTS

WO 9952192 10/1999

* cited by examiner

Primary Examiner—Michael Tokar
Assistant Examiner—Khai M. Nguyen

(57) ABSTRACT

A monolithic RF amplifier (20,30,40,50,60,70) senses the instantaneous voltage on the amplifier output (28) and utilizes active devices (22,33,41,42,51,61,71) to protect an output stage (21,31) of the amplifier from excessive voltages applied to the amplifier output (28).

20 Claims, 3 Drawing Sheets

RF AMPLIFIER AND METHOD THEREFOR

BACKGROUND OF THE INVENTION

The present invention relates, in general, to electronics, and more particularly, to semiconductor devices.

With the increasing growth of wireless communications, radio frequency (RF) amplifiers are finding use in many new and varied applications. In the past, radio frequency (RF) amplifiers typically included a high frequency power transistor which was operated in a non-saturated mode to drive a load such as an antenna. In the ideal situation, the impedance of the load was perfectly matched to the output impedance of the amplifier. However, in almost all cases the load was not perfectly matched. Various other events could also cause a load mismatch. Some examples of such events include a service technician decoupling the load to service equipment or cables being severed by construction work and other events. These mismatches caused the output voltage on the amplifier output to increase. Typically, such increases could result in the output voltage increasing past the breakdown voltage of the high frequency power transistor thereby damaging the transistor. In order to minimize the damage, passive elements, such as capacitors and inductors, were externally connected to the output in a effort to reduce the voltage coupled back to the amplifier. These passive elements typically had detrimental effects on the operating parameters of the amplifier. Such passive elements dissipated power and resulted in higher power dissipation by the amplifier. Additionally, the passive elements could reduce the power gain, efficiency, and linearity of power the amplifier. Further, the passive elements increased the cost of the system containing the amplifier.

In other cases, diodes were externally connected to the output in parallel with the load in an effort to minimize damage to the amplifier. The diodes had to have a power dissipation that was sufficiently large enough to dissipate all the power that was presented to the amplifier output. Consequently, the diodes were large and had parasitic elements that also detrimentally effected the amplifier's performance. The diodes also increased the amplifier's costs.

Accordingly it is desirable to have a method of protecting an amplifier from excessive voltages on the output without degrading the performance of the amplifier.

BRIEF DESCRIPTION OF THE DRAWINGS

For simplicity and clarity of illustration, elements in the figures are not necessarily to scale, and the same reference numbers in different figures denote the same elements. Additionally, descriptions and details of well known steps and elements are omitted for simplicity of the description.

DETAILED DESCRIPTION OF THE DRAWINGS

The present invention provides a method of sensing or monitoring the instantaneous voltage on the output of a radio frequency (RF) amplifier and coupling an active semiconductor device to reduce a gain of the amplifier in response to the instantaneous voltage reaching a maximum operating voltage of the amplifier. This assists in preventing the application of excessively large instantaneous voltages to the output of the amplifier which assists in preventing damage to the amplifier. Those skilled in the art will note that the voltages applied by a power supply are often referred to as the applied voltage. The voltage applied to the output during normal operation from all sources including reflections from a load is commonly referred to as the instantaneous voltage on the output or the instantaneous output voltage or the instantaneous voltage. The maximum value of the instantaneous voltage that is expected on the output during normal conditions including conditions of mismatched load, no load, and incorrect applied voltage can vary from about two to four times the applied voltage and in some cases may be five to six times the applied voltage. The maximum operating voltage is the voltage value that is above a maximum value that is expected for the instantaneous voltage during normal operation but is less than the breakdown voltage of the amplifier.

Figure 1:
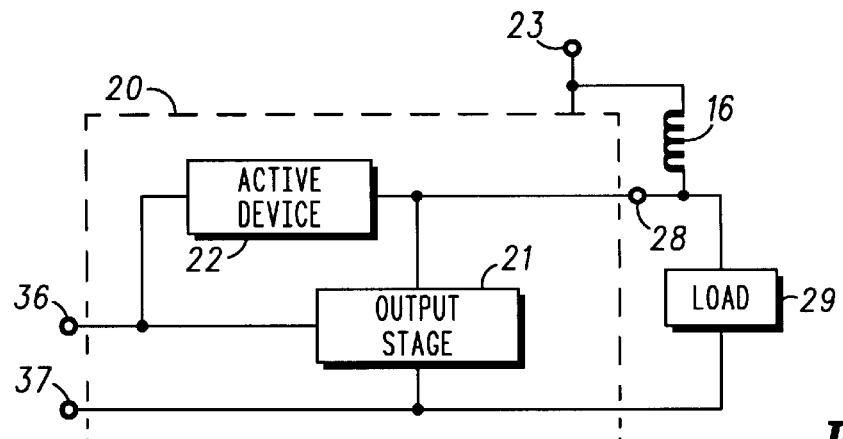
FIG. 1 schematically illustrates an embodiment of an amplifier in accordance with the present invention.

FIG. 1 schematically illustrates an embodiment of a monolithic RF amplifier 20 that couples an active device to monitor or sense the instantaneous voltage of amplifier 20 and reduce the gain of amplifier 20 when the instantaneous voltage reaches the maximum operating voltage but before it reaches the breakdown voltage of amplifier 20. A power supply 23 and a power return 37 provide applied power to amplifier 20, often referred to as the applied power. An inductor 16 represents inductive loading resulting from the impedance matching network or from an RF choke that is typically inserted to isolate the applied power from any RF energy. Amplifier 20 includes an output stage 21 that is suitable for supplying power to drive an instantaneous voltage to an external load 29 through an output 28 of amplifier 20 or amplifier output 28. Typically, stage 21 includes an output coupled to output 28, an input 34 coupled to an input 36 of amplifier 20, and a current carrying terminal coupled to a power return 37 of the amplifier. As will be noted by one skilled in the art, stage 21 could include several stages of amplification. Amplifier 20 utilizes an active device 22 that is coupled to output 28. Device 22 utilizes active semiconductor devices to monitor the instantaneous voltage on output 28 and reduce the gain of stage 21 when the instantaneous voltage reaches a first value or a maximum operating voltage of amplifier 20. Because amplifier 20 is an RF amplifier, the instantaneous voltage on output 28 varies depending on the impedance matching between load 29 and the output impedance of amplifier 20. If the impedances are perfectly matched, the instantaneous voltage varies from a maximum of about twice the voltage of power supply 23 to a minimum of about the value applied to power return 37. As stated hereinbefore, under other conditions, the maximum value of the instantaneous voltage can be higher. However when under other non-normal conditions, the voltage on the output can exceed the maximum operating voltage and reach or exceed the breakdown voltage of amplifier 20. Without active device 22, these non-normal voltages can cause damage to amplifier 20.

Consequently, device 22 protects amplifier 20 from such excessive voltages. When the maximum value of the instantaneous voltage reaches the maximum operating voltage of amplifier 20, device 22 turns-on and reduces the input signal to stage 21 thereby reducing the gain of stage 21 and reducing the voltage applied to output 28. Device 22 remains turned-on until the instantaneous voltage is reduced to a value that is near or below the maximum operating voltage of amplifier 20.

Figure 2:
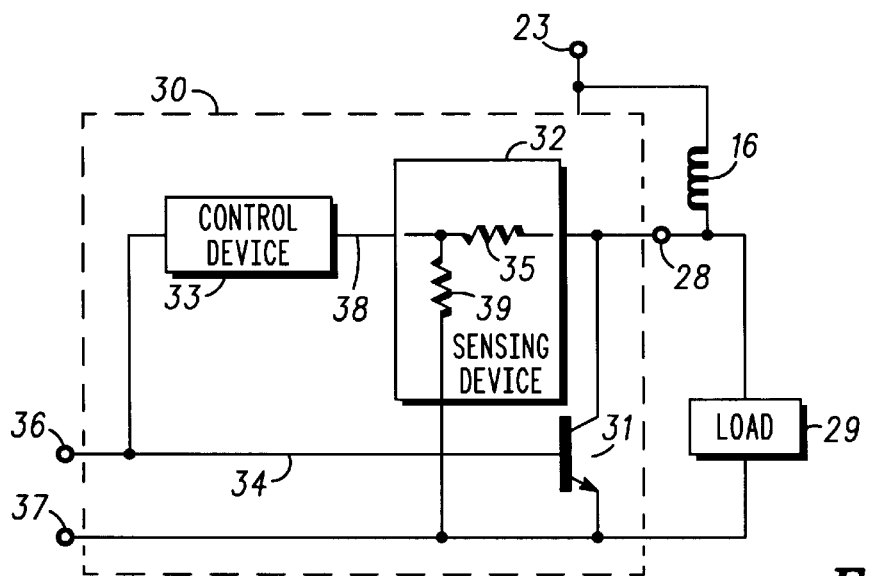
FIG. 2 schematically illustrates a second embodiment of an amplifier in accordance with the present invention.

FIG. 2 schematically illustrates an amplifier 30 that is an alternate embodiment of amplifier 20 shown in FIG. 1. Amplifier 30 has an RF power output stage 31 that is similar to output stage 21 explained in the description of FIG. 1. Although stage 31 is illustrated as an individual RF power transistor, stage 31 may be a Darlington transistor or other RF power output configuration. For example, stage 31 may be formed from two or three successive amplification stages in order to provide the desired gain. Although stage 31 may be referred to hereinafter as a transistor 31, it should be noted that transistor 31 can be any of these types of elements.

In one embodiment of amplifier 30, stage 31 is a III–V transistor formed from materials in the group III and group V elements of the periodic chart of elements, such as a gallium arsenide (GaAs) hetero-junction bipolar transistor (HBT). In the preferred embodiment, stage 31 is a silicon-germanium (SiGe) HBT. In other embodiments, stage 31 can be a SiGe or GaAs HFET or other similar type of RF transistor in one embodiment, amplifier 30 utilizes an active sensing device or sensing device 32 coupled to sense or monitor the instantaneous voltage of amplifier 30 and apply a control signal on a control input 38 of a device 33 in response to the instantaneous voltage reaching the maximum operating voltage. Amplifier 30 includes an active control device or control device 33 coupled to reduce an input voltage on an input 34 of stage 31 in response to the control signal from sensing device 32. In another embodiment, amplifier 30 utilizes a passive sensing device such as a resistor divider, coupled to sense or monitor the instantaneous voltage of amplifier 30 and apply a control signal on control input 38. One example of such a passive sensing device is illustrated by a resistor divider using a resistor 35 coupled to output 28 and a resistor 39 coupled to power return 37.

It should be noted that the control device may couple to any of the stages in such successive amplification stages in order to reduce the gain of the amplifier. Furthermore, it should be noted that the amplifier may have several different sensing devices and associated active control devices with each active control device coupling to a different amplification stage of such successive amplification stages.

Figure 3:
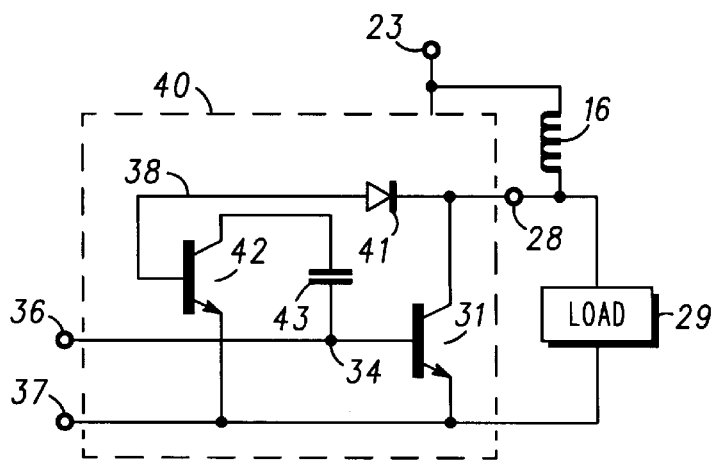
FIG. 3 schematically illustrates a third embodiment of an amplifier in accordance with the present invention.

FIG. 3 schematically illustrates an embodiment of an amplifier 40 that is an alternate embodiment of amplifier 30 explained in the description of FIG. 2. Amplifier 40 utilizes a diode 41 for sensing device 32 that is shown in FIG. 2, and a transistor 42 for control device 33 that is shown in FIG. 2. Diode 41 has a cathode connected to sense the instantaneous voltage on output 28, and an anode coupled to supply a control signal to a control input of transistor 42. Transistor 42 has a first current terminal coupled through a capacitor 43 to input 34 of output stage or transistor 31, and a second current terminal connected to power return 37. In one embodiment of amplifier 40, transistor 42 is formed from materials in the group III and group V elements of the periodic chart of elements, such as a gallium arsenide (GaAs) hetero-junction bipolar transistor (HBT). In the preferred embodiment, transistor 42 is a silicon-germanium (SiGe) HBT. In other embodiments, transistor 42 can be a SiGe or GaAs HFET or other similar type of transistor.

In operation, diode 41 and transistor 42 are turned-off as long as the instantaneous voltage on output 28 remains below the reverse bias breakdown voltage of diode 41. Since transistor 42 is ac coupled to input 34 so there is no DC current and no load to interfere with the operation of transistor 31. At and above this breakdown voltage of diode 41, diode 41 supplies current from output 28 to the control input of transistor 42 turning-on transistor 42. Because transistor 42 is ac coupled, there is no DC collector current, thus, transistor 42 turns on quickly in saturation pulling input 34 to a low impedance. Consequently, transistor 42 absorbs some of the power supplied to input 34. Typically, the impedance of the source that is driving input 34 is matched to the input impedance of transistor 31. Pulling input 34 to a low impedance through saturated transistor 42 unbalances the impedances and reflects a portion of the power back into the driving source.

Optionally, capacitor 43 may be omitted so that the first current terminal of transistor 42 is coupled to input 34. In operation, as transistor 42 turns-on, it takes current away from input 34 thereby reducing the gain of transistor 31 and amplifier 40. Consequently, the maximum value of the instantaneous voltage on output 28 is reduced to a value that is approximately the reverse breakdown voltage of diode 41. Therefore, the reverse breakdown voltage of diode 41 is chosen to be at least equal to the maximum operating voltage of transistor 31 but below the voltage that causes damage to transistor 31, such as the breakdown voltage. Typically, the reverse breakdown voltage is chose to be slightly larger than the normal value of the instantaneous voltage in order to allow amplifier 40 to function normally. Such a value allows amplifier 40 to function with load impedances that are approximately the same as the output impedance of amplifier 40, yet protects amplifier 40 from non-normal operating conditions.

Typically, diode 41 has a very fast transition time, thus, transistor 42 and diode 41 rapidly protect amplifier 40 from excessive instantaneous voltages. The reverse breakdown voltage of diode 41 can be selected somewhat through careful device design. However, if the required reverse breakdown voltage of diode 41 is not available through such device design, other embodiments of the amplifier may be utilized as explained hereinafter.

Figure 4:
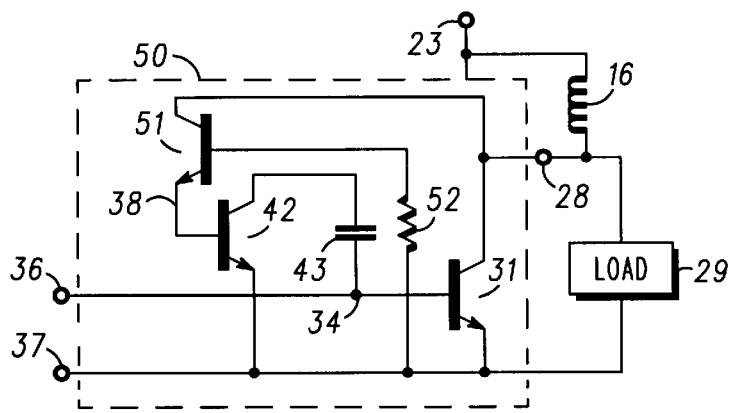
FIG. 4 schematically illustrates a fourth embodiment of an amplifier in accordance with the present invention.

FIG. 4 schematically illustrates an amplifier 50 that is another embodiment of amplifier 30 shown in FIG. 2. Amplifier 50 utilizes a bipolar transistor 51 for sensing device 32 that is shown in FIG. 2. Transistor 51 may be a variety of RF transistors such as those formed from the III–V materials of the periodic chart of elements, such as a GaAs HBT transistor. In the preferred embodiment, transistor 51 is a SiGe HBT transistor. Transistor 51 is coupled to utilize the three terminal breakdown characteristics of transistor 51 to provide a very rapid turn-on of transistor 42 thereby reducing the gain of amplifier 50 in response to a small variation in the instantaneous voltage of amplifier 50. Transistor 51 has a sensing terminal or first current electrode coupled to receive the instantaneous voltage on output 28, and a control signal terminal or second current electrode coupled to provide the control signal to transistor 42 at input 38. A control electrode of transistor 51 is coupled to power return 37 through a resistor 52.

In operation, as the instantaneous voltage on output 28 increases above the collector-emitter breakdown voltage of transistor 51, current flows from the collector to the emitter of transistor 51. This is generally regarded as operating in the two terminal breakdown region ($BV_{CEO}$). Some of the current goes through the base, thus, through resistor 52 which develops a voltage sufficient to turn-on transistor 51. As transistor 51 turns-on the current through transistor 51 increases by the gain of transistor 51 thereby supplying a large current to transistor 42. This is generally regarded as operating in the three terminal breakdown region ($BV_{CER}$). As described in the description of FIG. 3, this rapidly turns-on transistor 42 which reduces the input signal to transistor 31 thereby reducing the gain of transistor 31 and thereby reducing the gain of amplifier 50.

The value of $BV_{CEO}$ is determined by the semiconductor process technology used to form transistor 42. However, the value of $BV_{CER}$ can be changed by changing the value of resistor 52. Thus, resistor 52 is selected to provide a breakdown voltage for transistor 51 that is no less than the maximum operating voltage for amplifier 50 and preferable is slightly larger than the instantaneous voltage for normal operating conditions in order to provide the desired protection for amplifier 50 and allow amplifier 50 to function normally. The preferable maximum value for the breakdown voltage of transistor 51 is generally less than the voltage that damages amplifier 50. By selecting the value of resistor 52 the effective breakdown voltage can be set somewhere between the two terminal and three terminal breakdown voltage values, thus, providing control over the breakdown voltage used for transistor 51. In an alternate embodiment, resistor 52 has a first terminal connected to the control electrode of transistor 51 and a second terminal connected to input 38. In this alternate configuration, transistor 51 and resistor 52 function similarly to the previous explanation of amplifier 50.

It should be noted that transistor 31 may have multiple stages as described hereinbefore. In such configurations, the amplifier may have multiple sense devices, such as transistor 51, that each supply a sense signal at a different value of the instantaneous voltage on output 28. The sense signals may all be supplied to one active control device, such as transistor 42, or each one may be supplied to a separate active control device.

Figure 5:
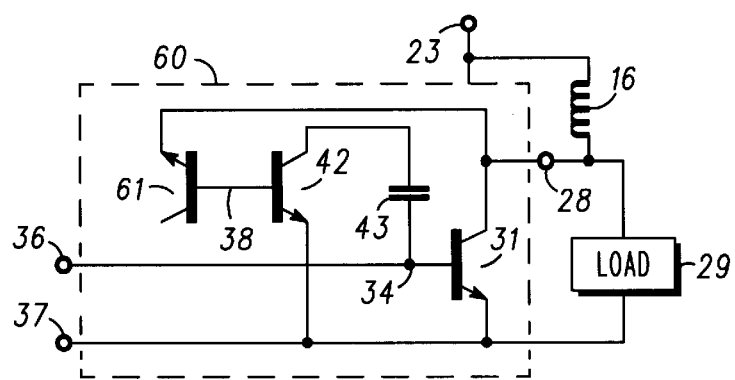
FIG. 5 schematically illustrates a fifth embodiment of an amplifier in accordance with the present invention.

FIG. 5 schematically illustrates an amplifier 60 that is another alternate embodiment of amplifier 30 shown in FIG. 2. Amplifier 60 uses a bipolar transistor 61 for sensing device 32 that is shown in FIG. 2. Transistor 61 may be a variety of RF transistors such as those formed from the III–V materials of the periodic chart of elements, such as a GaAs HBT transistor. In the preferred embodiment, transistor 61 is a SiGe HBT transistor. Transistor 61 utilizes the emitter-base reverse breakdown voltage ($BV_{EBO}$) of transistor 61 to provide the sense signal to transistor 42. Transistor 61 is coupled to have a sensing terminal or first current electrode coupled to sense the instantaneous voltage on output 28, and a control electrode coupled to provide the sense signal to input 38 of transistor 42. In operation, when the voltage on output 28 is at least equal to the emitter-base reverse breakdown voltage ($BV_{EBO}$) of transistor 61, current flows through the emitter-base junction and supplies current to turn-on transistor 42. Transistor 42 turns-on reducing the gain as described hereinbefore in the description of FIG. 3. The $BV_{EBO}$ of transistor 61 can be designed by semiconductor device design techniques that are well known to those skilled in the art. Consequently, $BV_{EBO}$ is chosen to be no less than the maximum operating voltage and no greater than the breakdown voltage of amplifier 60 for the same reasons as explained in the description of FIG. 3.

Figure 6:
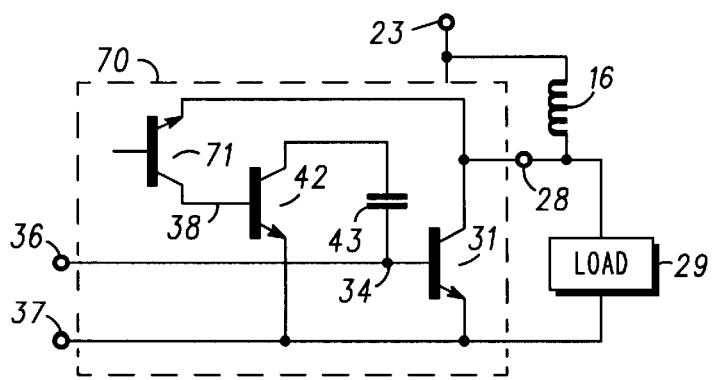
FIG. 6 schematically illustrates a sixth embodiment of an amplifier in accordance with the present invention.

FIG. 6 schematically illustrates an amplifier 70 that is an alternate embodiment of amplifier 60 shown in FIG. 5. Amplifier 70 uses a bipolar transistor 71 for sensing device 32 that is shown in FIG. 2. Transistor 71 may be a variety of RF transistors such as those formed from the III–V materials of the periodic chart of elements, such as a GaAs HBT transistor. In the preferred embodiment, transistor 71 is a SiGe HBT transistor. Transistor 71 utilizes the emitter-base reverse breakdown voltage ($BV_{EBO}$) of transistor 71 to provide the sense signal, in similar manner to transistor 61 explained in the description of FIG. 5. Transistor 71 is coupled to have a sensing terminal or first current electrode coupled to sense the instantaneous voltage on output 28, and a second current electrode coupled to provide the sense signal to input 38 of transistor 42. In operation, when the voltage on output 28 is at least equal to the emitter-base reverse breakdown voltage ($BV_{EBO}$) of transistor 71, current flows from the emitter to the collector of transistor 71 to provide current to the control electrode of transistor 42. Transistor 42 turns-on reducing the gain as described hereinbefore in the description of FIG. 3. The $BV_{EBO}$ of transistor 71 is chosen in the same manner and range as that of transistor 61 in the description of FIG. 5.

Figure 7:
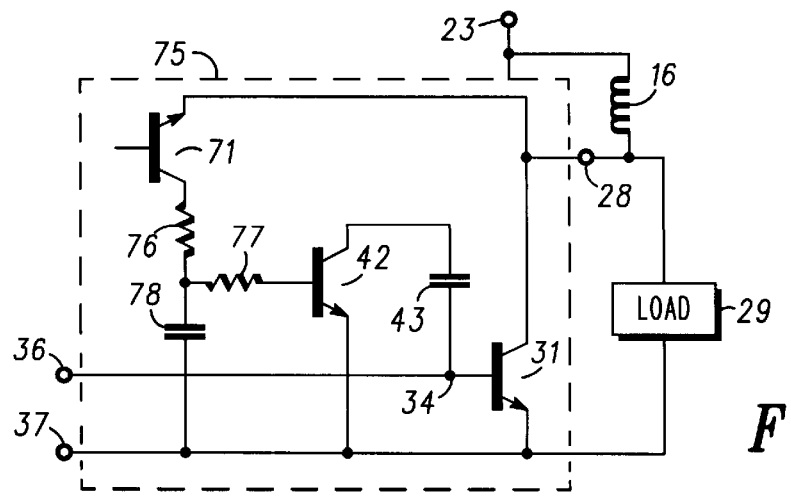
FIG. 7 schematically illustrates a seventh embodiment of an amplifier in accordance with the present invention.

FIG. 7 schematically illustrates an amplifier 75 that is an alternate embodiment of amplifier 70 shown in FIG. 6. The instantaneous voltage has an alternating waveform. Because of the waveform, amplifier 75 uses additional circuitry to assist keeping the sensing device and the control device turned-on during the entire cycle of the instantaneous voltage waveform. Transistor 71 has the second current electrode coupled to a first terminal of a resistor 76. A second terminal of resistor 76 is coupled through a capacitor 78 to voltage return 37. A resistor 77 has a first terminal coupled to the second terminal of resistor 76 and a second terminal coupled to the control electrode of transistor 42. Capacitor 78 functions to integrate the charge from transistor 71 and cause transistor 42 to remain turned-on during the entire cycle of the instantaneous voltage. Resistor 76 limits the current through transistor 71 during that time to prevent damaging transistor 71. Resistor 77 limits current through transistor 42 and also cooperates with capacitor 78 to establish a time constant for returning amplifier 75 to normal operation after the instantaneous voltage returns to a normal operating value.

In one example of an implementation of amplifier 75, resistor 76 has a value of six hundred ohms (600 ohms), resistor 77 has a value of three thousand three hundred ohms (3300 ohms), capacitor 78 has a value of 1.66 pico farads (1.66 pf), and capacitor 43 has a value of ten pico farads (10 pf). In this example, the applied voltage is 3.2 volts, the breakdown voltage is 18 volts, and the normal value of the instantaneous voltage is about eight volts. Consequently, the maximum operating voltage is somewhere greater than the eight volt normal operational value of the instantaneous voltage and less than the breakdown voltage of eighteen volts, thus, it is between eight and eighteen volts. In this example, the emitter-base reverse breakdown voltage ($BV_{EBO}$) of transistor 71, is set to a value of about twelve volts to provide a trigger voltage within the range of the value of the maximum operating voltage. In operation of this example of amplifier 75, the power gain of amplifier 75 was reduced by three decibels (3 db) when the maximum value of the instantaneous voltage reached the maximum operating voltage. This gain reduction prevented the application of excessively large instantaneous voltages to the output of the amplifier 75 in order to protect amplifier 75 from damage.

Figure 8:
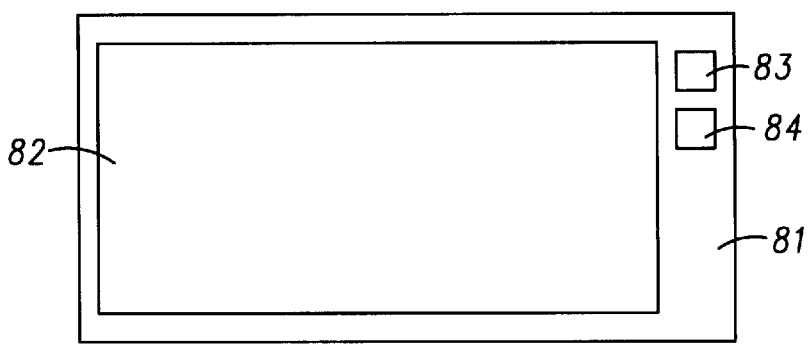
FIG. 8 schematically illustrates a simplified semiconductor device incorporating an amplifier in accordance with the present invention.

FIG. 8 schematically illustrates a plan view of a semiconductor substrate 80 on which amplifiers 20, 30, 40, 50, 60, 70, or 75 may be formed. In one embodiment, substrate 80 is formed from materials in the group III and group V elements of the periodic chart of elements. In the preferred embodiment, substrate 80 is formed from SiGe. An area 82 of substrate 80 represents an area where stage 21 or transistor 31 may be formed. An area 84 represents the area used for active device 22 or sensing device 32. An area 83 represent the location and area of control device 33 or transistor 42. Typically, the size of active device 22 or sensing device 32, and control device 33 or transistor 42 are less than about one-fourth the size of output stage 21 or transistor 31, and in the preferred embodiment are no greater than about one-tenth the size of output stage 21 or transistor 31. Consequently, the loading resulting from active device 22 or sensing device 32 and control device 33 or transistor 42 is negligible to output stage 21 or transistor 31 and have no significant effect on the power output, frequency response, and linearity of the normal operation of the amplifier.

While the invention is described with specific preferred embodiments, it is evident that many alternatives and variations will be apparent to those skilled in the semiconductor arts. More specifically some embodiments of the invention were described for a particular HBT transistor structure, although the method is directly applicable to bipolar and FET devices, as well as to other III–V, SiGe, and Si transistor structures. Additionally other techniques can be used to set the voltage at which the sensing device turns-on the control device.

By now it should be appreciated that there has been provided a novel method and structure for forming an RF amplifier. Using active semiconductor devices facilitates putting the protection devices on the same substrate with the output stage of the amplifier thereby reducing parasitic components and not degrading the performance of the amplifier, including the amplifier's power gain and frequency response. Typically, amplifier distortion is reduced by about fifty percent (50%) over prior art implementations. Additionally, using active devices facilitates providing rapid protection in response to the excessive voltage conditions, and facilitates easily modifying the active protection devices for different maximum operating voltages. Furthermore, the actives devices can be provided at a lower cost than external passive elements previously used to provide protection.

What is claimed is:

1. A method of protecting an RF amplifier from excessive instantaneous voltage comprising:
   providing the RF amplifier having an input and an output stage coupled to an inductive load for providing an instantaneous voltage on an output of the RF amplifier; and
   monitoring the instantaneous voltage and coupling an active device to produce an impedance mismatch at the input of the RF amplifier to reduce an input signal level at said input when the instantaneous voltage reaches a first voltage value.

2. The method of claim 1 wherein monitoring the instantaneous voltage and coupling the active device to reduce the amplifier gain when the instantaneous voltage reaches the first voltage value includes coupling the active device to reduce the amplifier gain in response to the instantaneous voltage reaching a maximum operating voltage of the output and prior to the instantaneous voltage reaching a value equal to a breakdown voltage of the RF amplifier.

3. The method of claim 1 wherein monitoring the instantaneous voltage and coupling the active device to reduce the amplifier gain includes coupling the active device from the output of the RF amplifier to an input of the RF amplifier to reduce an input voltage applied to the input of the RF amplifier.

4. The method of claim 1 wherein providing the RF amplifier includes providing an HBT for the output stage.

5. The method of claim 1 wherein providing the RF amplifier includes forming the RF amplifier from III–V semiconductor materials.

6. The method of claim 1 wherein providing the RF amplifier includes forming the RF amplifier from SiGe semiconductor materials.

7. The method of claim 1 wherein monitoring the instantaneous voltage includes coupling a resistor divider between the output of the RF amplifier and a power return.

8. The method of claim 1 wherein monitoring the instantaneous voltage and coupling the active device to reduce the amplifier gain in response to the instantaneous voltage reaching the first voltage value includes using a reverse breakdown voltage of another active device for determining that the instantaneous voltage at least equals the first voltage value.

9. A method of forming an RF amplifier comprising:
   forming the RF amplifier on a substrate to include an output stage having an HBT, a sensing device, and an active control device;
   coupling the sensing device on the substrate to sense an instantaneous voltage of the RF amplifier and supply a control signal in response to the instantaneous voltage reaching a maximum operating voltage of the RF amplifier; and
   AC coupling the active control device on the substrate to create an impedance mismatch that produces signal reflection that reduces an input signal to the output stage in response to the control signal supplied by the sensing device.

10. The method of claim 9 wherein coupling the active control device includes coupling a first transistor by coupling a control electrode of the first transistor to receive the control signal of an active sensing device, coupling a first current electrode of the first transistor to a voltage return, and coupling a second current electrode of the first transistor to a control input of the output stage.

11. The method of claim 10 wherein coupling the active sensing device includes coupling a second transistor having a first current electrode coupled to sense the instantaneous voltage, and a second current electrode coupled to the control electrode of the first transistor.

12. The method of claim 11 further including coupling a resistor to a control electrode of the second transistor and using the resistor to set a $BV_{CER}$ voltage of the second transistor.

13. A monolithic RF amplifier comprising:
   an output stage formed in a III–V substrate, the output stage comprising a III–V bipolar device having an output coupled to an inductor, an input, and a current carrying terminal;
   an active sensing device formed in the III–V substrate, the active sensing device comprising a III–V active device having a sensing terminal coupled to the output of the output stage and a control signal terminal; and
   a control device formed on the III–V substrate, the control device comprising a III–V active device having a control input coupled to the control signal terminal of the active sensing device, a first current terminal coupled to the input of the output stage, and a second current terminal wherein said control device changes an impedance at said input of the output stage in response to said active sensing device detecting a potentially damaging voltage transition at the output of the III–V bipolar device.

14. The monolithic RF amplifier of claim 13 wherein each of the active sensing device and the control device have a size that is no more than one-fourth a size of the output stage.

15. The monolithic RF amplifier of claim 13 wherein the output stage includes an HBT.

16. The monolithic RF amplifier of claim 13 wherein the output stage includes an HBT, and wherein the active sensing device includes a first transistor having a first current electrode coupled to the output of the output stage, a second current electrode, and a control electrode, and wherein the control device includes a second transistor comprising a bipolar transistor having a base coupled to the control signal terminal of the active sensing device, a collector coupled to the input of the output stage, and an emitter coupled to a voltage return.

17. The monolithic RF amplifier of claim 16 further including the first transistor comprising an HBT having the second current electrode coupled to the base of the second transistor.

18. The monolithic RF amplifier of claim 17 further including the first transistor having the base coupled to the base of the second transistor.

19. The monolithic RF amplifier of claim 16 wherein the HBT of the output stage, the first transistor, and the second transistor are all GaAs bipolar transistors.

20. The monolithic RF amplifier of claim 13 wherein the active sensing device is a GaAs diode having an anode coupled to the output of the output stage and a cathode, and wherein the control device includes a GaAs transistor having a base coupled to the anode of the GaAs diode, a collector coupled to the input of the output stage, and an emitter coupled to a voltage return.

* * * * *